（12）United States Patent
Yen et al.

(10) Patent No.: US 10,269,733 B2
(45) Date of Patent: Apr. 23, 2019

(54) INTEGRATED CIRCUIT DEVICE

(71) Applicant: REALTEK SEMICONDUCTOR CORP., Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/435,498

(22) Filed: Feb. 17, 2017

(65) Prior Publication Data

US 2017/0236791 A1    Aug. 17, 2017

(30) Foreign Application Priority Data

Feb. 17, 2016    (TW) .............................. 105104567 A

(51) Int. Cl.
| | | |
|---|---|---|
| *H01L 23/00* | (2006.01) | |
| *H01L 23/66* | (2006.01) | |
| *H01L 23/495* | (2006.01) | |

(52) U.S. Cl.
CPC .......... *H01L 23/66* (2013.01); *H01L 23/4952* (2013.01); *H01L 24/09* (2013.01); *H01L 24/49* (2013.01); *H01L 24/48* (2013.01); *H01L 2223/6611* (2013.01); *H01L 2223/6627* (2013.01); *H01L 2224/0912* (2013.01); *H01L 2224/45015* (2013.01); *H01L 2224/45111* (2013.01); *H01L 2224/45124* (2013.01); *H01L 2224/45147* (2013.01); *H01L 2224/4813* (2013.01); *H01L 2224/4912* (2013.01)

(58) Field of Classification Search
CPC ........ H01L 21/4885–21/4896; H01L 23/4952; H01L 24/09; H01L 24/43; H01L 24/46; H01L 24/42–24/49; H01L 2223/6611; H01L 2224/0912; H01L 2224/49123; H01L 2224/4912
See application file for complete search history.

(56) References Cited

U.S. PATENT DOCUMENTS

| | | | |
|---|---|---|---|
| 5,789,808 A * | 8/1998 | Yamasaki | ............... H01L 23/50 257/665 |
| 6,812,580 B1 | 11/2004 | Wenzel et al. | |
| 7,501,709 B1 * | 3/2009 | Hool | ....................... H01L 23/64 257/691 |
| 8,436,450 B2 * | 5/2013 | Menon | .................... H01L 23/66 257/664 |

(Continued)

FOREIGN PATENT DOCUMENTS

| | | |
|---|---|---|
| EP | 2461335 A1 | 6/2012 |
| TW | 200416974 A | 9/2004 |

(Continued)

*Primary Examiner* — Kevin M Picardat
(74) *Attorney, Agent, or Firm* — Li & Cai Intellectual Property (USA) Office

(57) ABSTRACT

The instant disclosure provides an integrated circuit device including a transmission line which includes a first ground line and a signal line. The first ground line includes a first pad, a second pad and a first bonding wire that is a bond wire structure connecting the first pad and the second pad. The first signal line includes a third pad, a fourth pad and a second bonding wire that is a bond wire structure connecting the third pad and the fourth pad.

8 Claims, 10 Drawing Sheets

(56) References Cited

U.S. PATENT DOCUMENTS

| | | | |
|---|---|---|---|
| 9,159,681 B2* | 10/2015 | Nakayama | H01L 24/03 |
| 2005/0017352 A1 | 1/2005 | Lee | |
| 2006/0119448 A1* | 6/2006 | Lee | H01L 24/49 |
| | | | 333/5 |
| 2007/0023898 A1* | 2/2007 | Gospodinova | H01L 23/13 |
| | | | 257/734 |
| 2009/0294158 A1* | 12/2009 | Matsushima | H01L 23/49816 |
| | | | 174/257 |
| 2010/0315181 A1 | 12/2010 | Mina et al. | |
| 2012/0038054 A1* | 2/2012 | Wyland | H01L 23/5383 |
| | | | 257/773 |

FOREIGN PATENT DOCUMENTS

| | | |
|---|---|---|
| TW | M24285 | 9/2004 |
| TW | 200504972 | 2/2005 |
| TW | 200514223 | 4/2005 |
| TW | 201123605 A1 | 7/2011 |

* cited by examiner

INTEGRATED CIRCUIT DEVICE

BACKGROUND

1. Technical Field

The instant disclosure relates to an integrated circuit device, in particular, to a transmission line in the integrated circuit device.

2. Description of Related Art

Conventional transmission lines in CMOS process are capable of carrying low frequency alternating current and audio signals. The transmission lines utilize specific structure and methods for performing impedance matching and thus the electromagnetic signals carried can reach the receiver end with the smallest reflection and power loss. Most transmission lines have a significant characteristic in that they have uniform cross sections along the lengthwise direction, thereby having uniform impedance which is referred to as characteristic impedance which prevents reflection. There are many forms of transmission lines such as parallel lines (stepped, twisted pair), coaxial cable, stripline and microstrip. The frequency of the electromagnetic wave is inversely proportional to the wavelength thereof. When the length of the cable is equal to the wavelength of the transmission signal, there is a need for the use of a transmission line.

Transmission lines are also used in integrated circuit devices, generally as coplanar waveguide structures having signal line and the ground line that are parallel, or as stripline structures in which the transmission lines are surrounded by the ground lines. However, in order to maintain the sufficiently low characteristic impedance, the transmission lines must occupy sufficiently large space in the structure. Due to the integrated circuit devices becoming smaller in size, and the parasitic capacitance becoming larger, the difficulties in the designing of the transmission lines in the integrated circuit devices are increasing.

SUMMARY

In view of the above problems, an object of the instant disclosure is to provide a transmission line for an integrated circuit device, where the transmission line does not occupy or only occupies a small area of the integrated circuit device and can thus provide sufficiently low characteristic impedance.

An exemplary embodiment of the instant disclosure provides an integrated circuit device, comprising a transmission line which comprises a first ground line and a first signal line. The first ground line comprises a first pad, a second pad and a first bonding wire which is a bond wire structure connecting the first pad and the second pad. The first signal line comprises a third pad, a fourth pad and a second bonding wire which is a bond wire structure connecting the third pad and the fourth pad.

Another exemplary embodiment of the instant disclosure provides an integrated circuit device comprising a transmission line which comprises a signal line and a ground line, in which one of the signal line and the ground line comprises a first pad, a second pad and a first bonding wire which is a bond wire structure connecting the first pad and the second pad.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
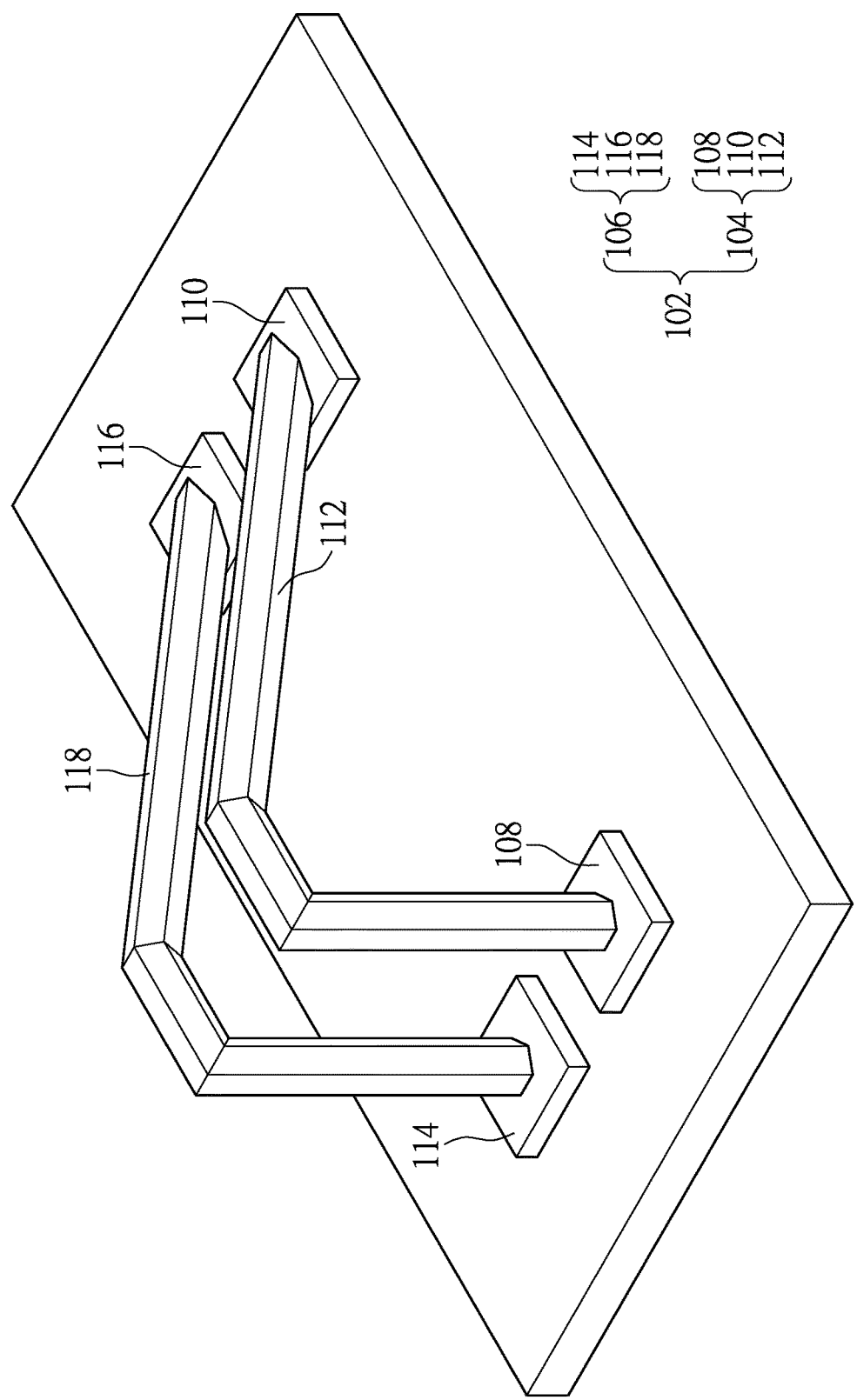
FIG. 1 is a three-dimensional schematic view of the transmission line of the integrated circuit device of an embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

First Embodiment

FIG. 1 is a three-dimensional schematic view of the transmission line of the integrated circuit device in an embodiment of the instant disclosure. As shown in FIG. 1, the transmission line 102 comprises a ground line 104 and a signal line 106. The ground line 104 comprises a first pad 108, a second pad 110 and a first bonding wire 112 that is a bond wire structure connecting the first pad 108 and the second pad 110. The signal line 106 comprises a third pad 114, a fourth pad 116, and a second bonding wire 118 that is a bond wire structure connecting the third pad 114 and the fourth pad 116.

Although FIG. 1 only shows a transmission line 102 of Ground-Signal (GS) type comprising the ground line 104 and the signal line 106, the integrated circuit device can comprise a plurality of transmission lines 102 in actual implementation and the number and size of the transmission lines 102 can be determined based on design need and is not limited to the instant disclosure. Generally, the length of the transmission lines is from 500-1500 µm, the diameter is 18-25 µm and the transmission lines are spaced at 5-15 µm. For example, the material for forming the transmission lines may be copper, tungsten, aluminum, or tin. In addition, the instant disclosure is not limited to the GS type transmission line shown in FIG. 1.

Figure 2:
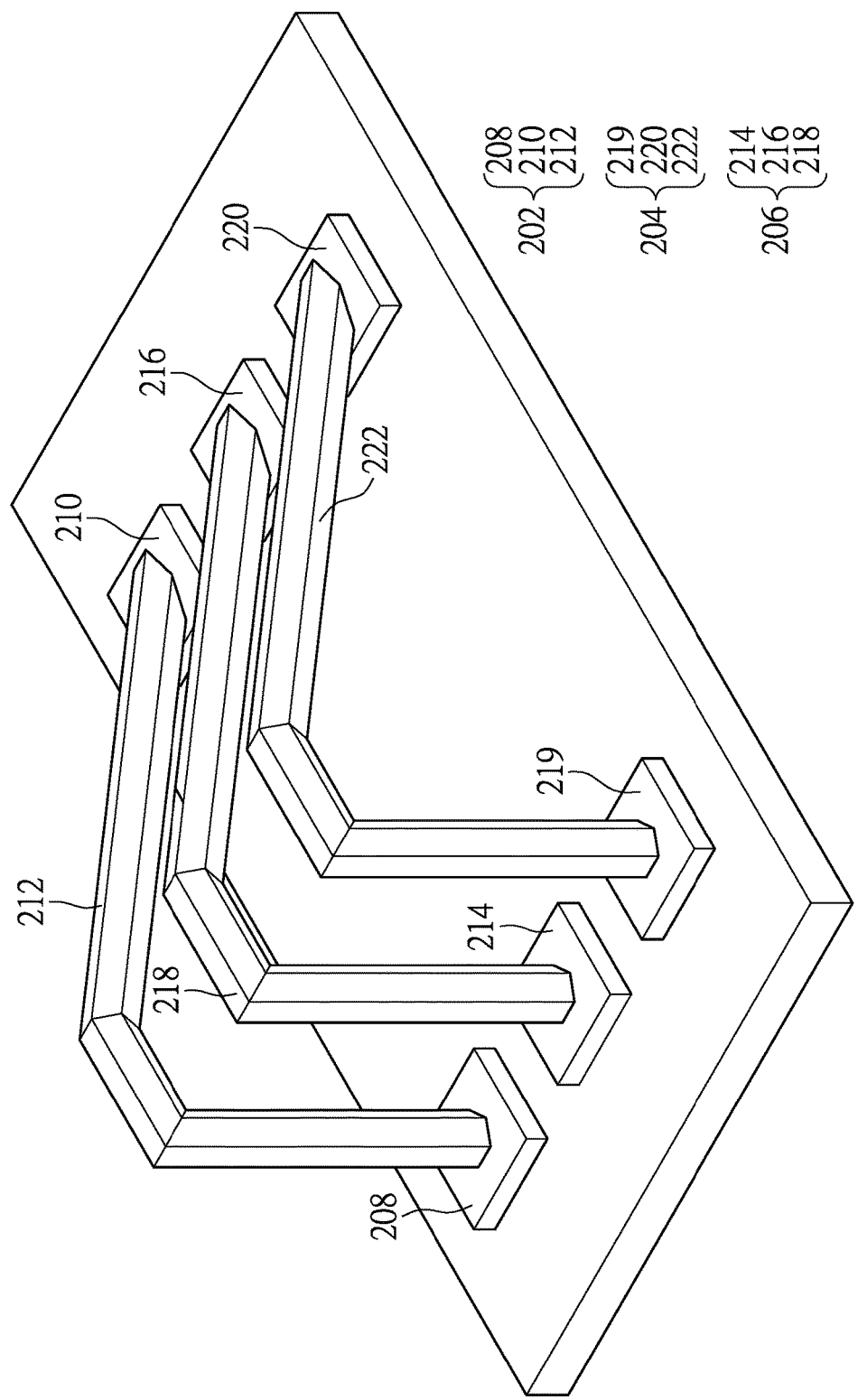
FIG. 2 is a three-dimensional schematic view of the transmission line of the integrated circuit device of an embodiment of the instant disclosure.

As shown in FIG. 2, another embodiment of the instant disclosure can be a transmission line 100 of Ground-Signal-Ground (GSG) type, i.e., the transmission line of the present embodiment comprises two ground lines 202, 204 and a signal line 206 arranged between the two ground lines 202, 204. Specifically, the transmission line of the present embodiment comprises a first ground line 202, a signal line 206 and a second ground line 204. The signal line 206 is arranged between the first ground line 202 and the second ground line 204. The first ground line 202 comprises a first pad 208, a second pad 210 and a first bonding wire 212. The first bonding wire 212 is a bond wire structure connecting the first pad 208 and the second pad 210. The signal line 206 comprises a third pad 214, a fourth pad 216, and a second bonding wire 218 that is a bond wire structure connecting the third pad 214 and the fourth pad 216. The second ground line 204 comprises a fifth pad 219, a sixth pad 220 and a third bonding wire 222 that is a bond wire structure connecting the fifth pad 219 and the sixth pad 220.

Figure 3:
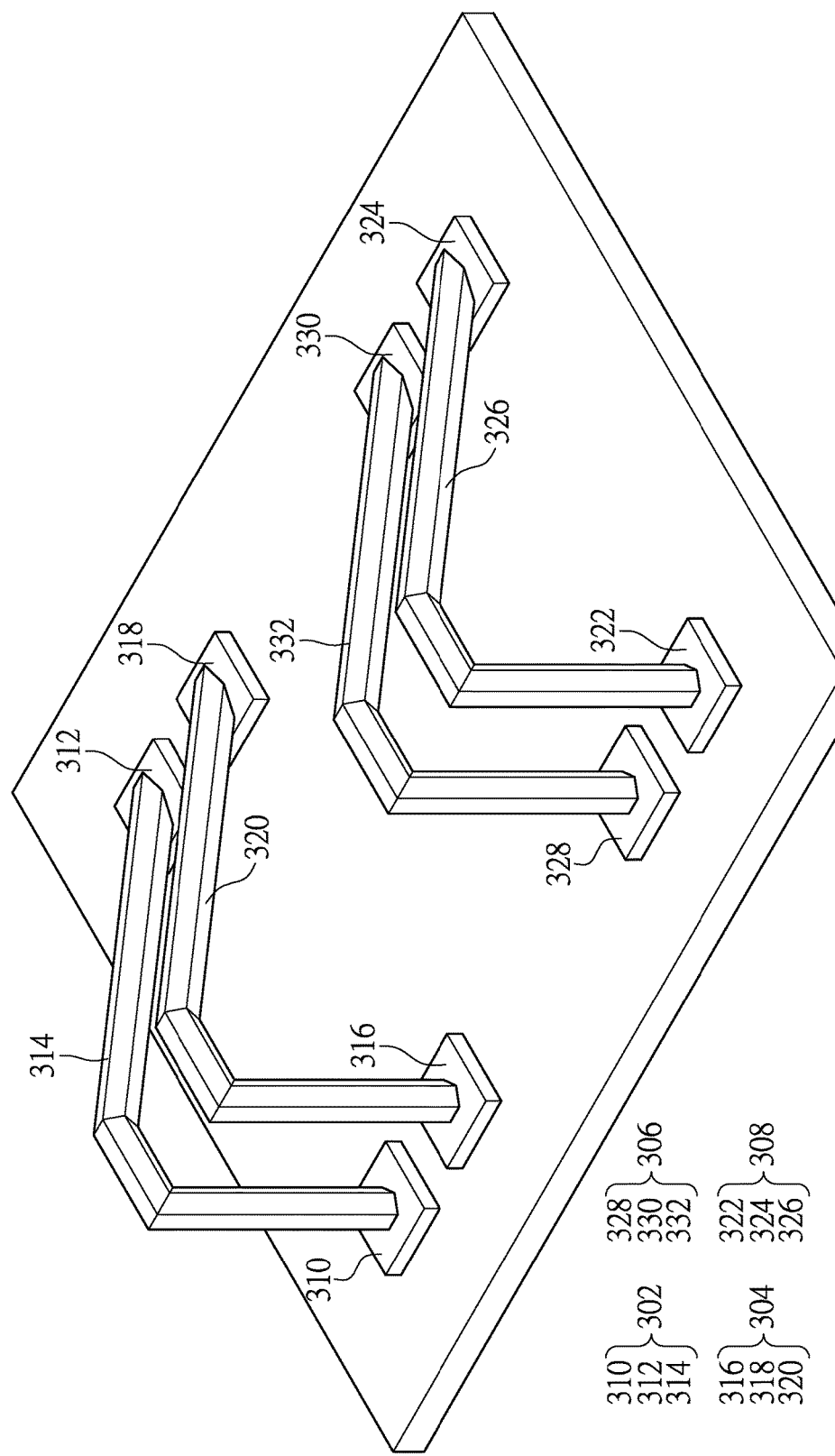
FIG. 3 is a three-dimensional schematic view of the transmission line of the integrated circuit device of an embodiment of the instant disclosure.

As shown in FIG. 3, another embodiment of the instant disclosure can be a transmission line of Ground-Signal-Signal-Ground (GSSG) type, i.e., the transmission line comprises two ground lines and two signal lines, and the signal lines are arranged between the two ground lines. Specifically, the transmission line comprises a first ground line 302, a first signal line 304, a second signal line 306, and a second ground line 308 sequentially arranged in a direction. The first ground line 302 comprises a first pad 310, a second pad 312 and a first bonding wire 314 that is a bond wire structure connecting the first pad 310 and the second pad 312. The first signal line 306 comprises a third pad 316, a fourth pad 318 and a second bonding wire 320 that is a bond wire structure connecting the third pad 316 and the fourth pad 318. The second ground line 308 comprises a fifth pad 322, a sixth pad 324 and a third bonding wire 326 that is a bond wire structure connecting the fifth pad 322 and the sixth pad 324. The second signal line 306 comprises a seventh pad 328, an eighth pad 330 and a fourth bonding wire 332 that is a bond wire structure connecting the seventh pad 328 and the eighth pad 330.

Figure 4:
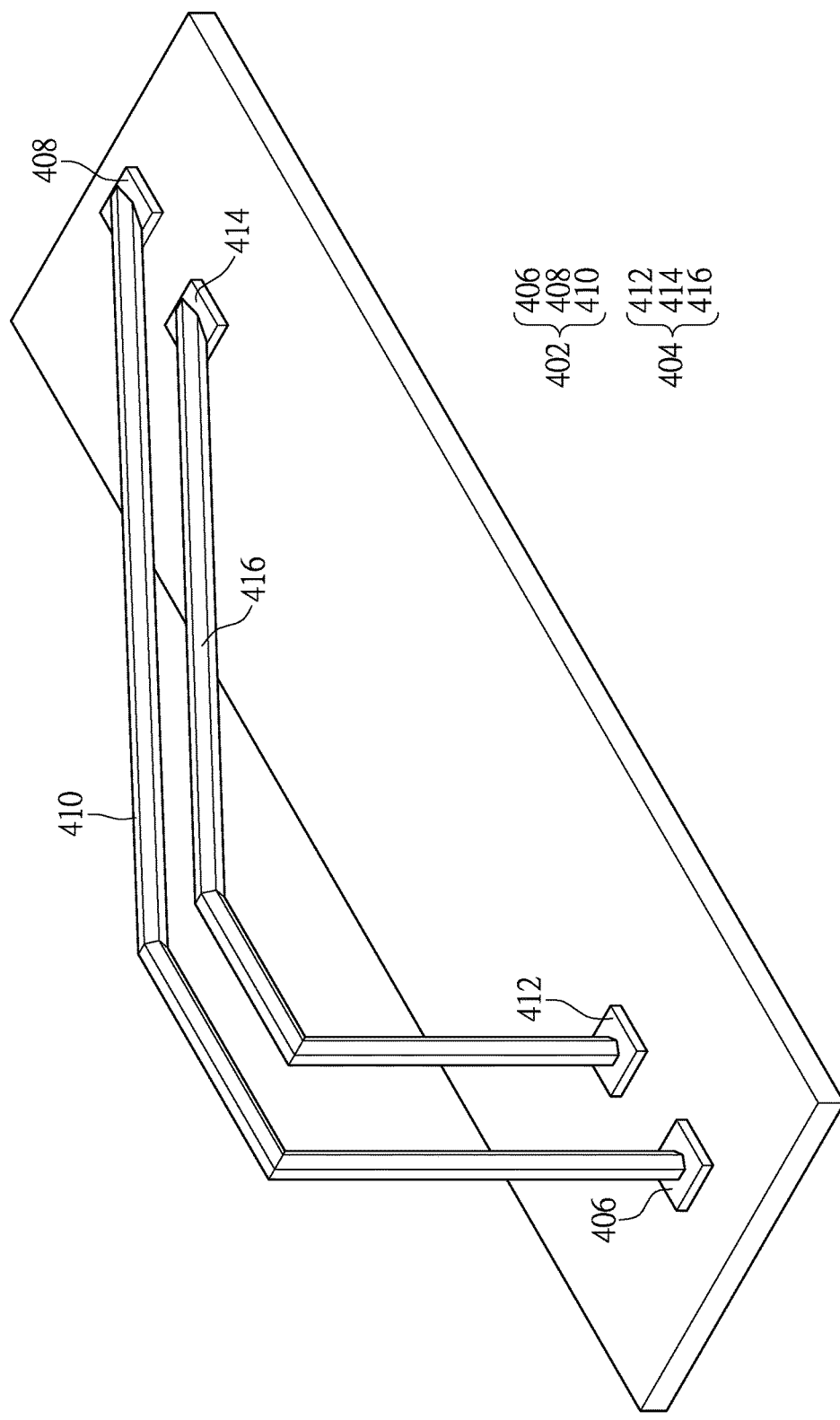
FIG. 4 is a three-dimensional schematic view of the transmission line of the integrated circuit device of an embodiment of the instant disclosure.

Although the ground lines and signal lines of the transmission lines shown in FIG. 1, FIG. 2 and FIG. 3 are arranged in a parallel direction (and parallel to each other), the instant disclosure is not limited thereto. FIG. 4 is a three-dimensional schematic view of the transmission line of the integrated circuit device of another embodiment of the instant disclosure. As shown in FIG. 4, the transmission line comprises a ground line 402 and a signal line 404. The ground line 402 and the signal line 404 are arranged in a longitudinal or lengthwise direction and hence, a first pad 406 and a second pad 408 of the ground line 402 and a third pad 412 and a fourth pad 414 are arranged along the same straight line, and the first bonding wire 410 and the second bonding wire 416 are arranged in a lengthwise direction. Specifically, the first bonding wire 410 is arranged above the second bonding wire 416. As shown in FIG. 4, the signal line 404 is arranged below the ground line 402, and the bonding wire 410 is substantially arranged above the second bonding wire 416.

Figure 5:
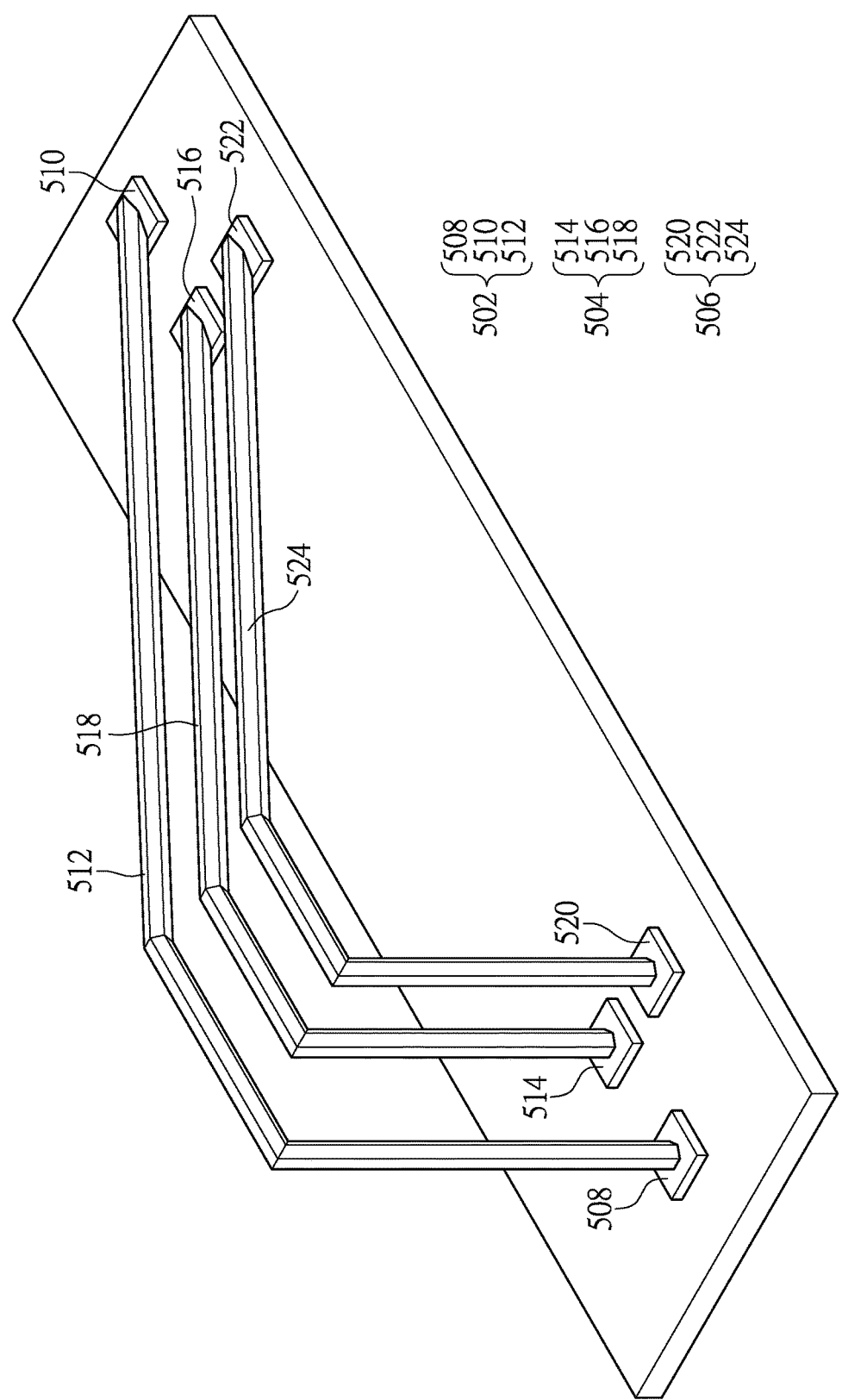
FIG. 5 is a three-dimensional schematic view of the transmission line of the integrated circuit device of an embodiment of the instant disclosure.

FIG. 5 is a three-dimensional schematic view of the transmission line of the integrated circuit device of another embodiment of the instant disclosure. As shown in FIG. 5, the transmission line is a Ground-Signal-Ground (GSG) type transmission line and comprises a first ground line 502, a signal line 504, and a second ground line 506. The first ground line 502 and the signal line 504 are arranged in a lengthwise direction, and the second ground line 506 and the signal line 504 are arranged in parallel. Specifically, the first pad 508 and the second pad 510 of the first ground line 502, and the third pad 514 and the fourth pad 516 of the signal line 504 are arranged along the same straight line. The first bonding wire 512 and the second bonding wire 518 are arranged in a lengthwise direction. Therefore, a portion of the first bonding wire 512 is arranged above the second bonding wire 518. The fifth pad 520 of the second ground line 506 and the third pad 514 of the signal line 504 are parallel to each other, and the sixth pad 522 of the second ground line 506 and the fourth pad 516 of the signal line 504 are also arranged parallel to each other. The third bonding wire 524 of the second ground line 506 and the second bonding wire 518 of the second bonding wire 504 are arranged in parallel.

Second Embodiment

Figure 6:
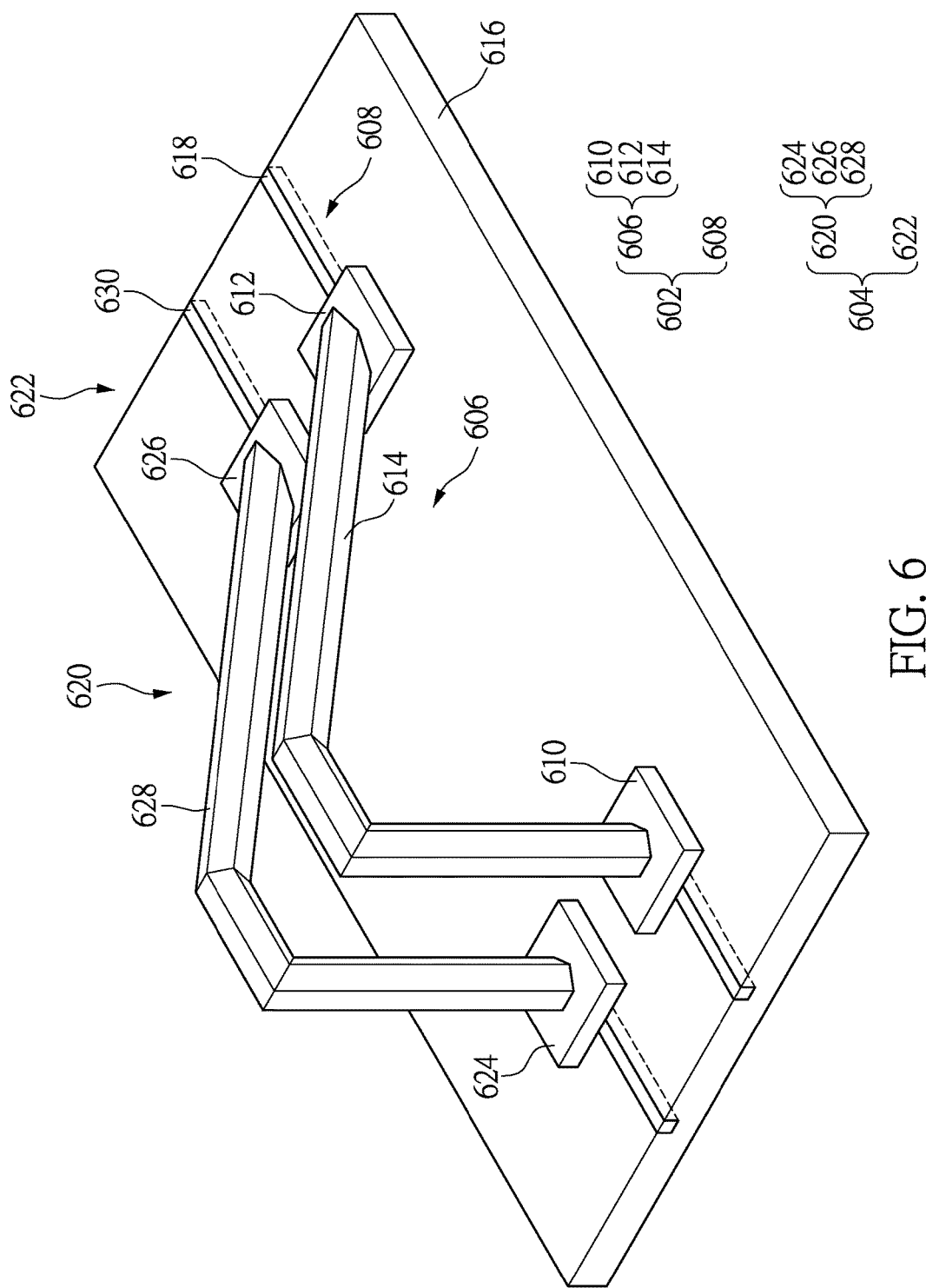
FIG. 6 is a three-dimensional schematic view of the transmission line of the integrated circuit device of an embodiment of the instant disclosure.

FIG. 6 is a three-dimensional schematic view of the transmission line of another embodiment of the instant disclosure. The difference between FIG. 1 and the present embodiment is that the ground line and the signal line of the transmission line 102 of the embodiment shown in FIG. 1 entirely adopt a bond wire form arranged on the integrated circuit device, while in the present embodiment, a portion of the ground line and a portion of the signal line of the transmission line are conducting wires arranged on or in a dielectric layer of the integrated circuit, and a portion of the ground line and a portion of the signal line adopt a bond wire form arranged on the integrated circuit device.

Referring to FIG. 6, the transmission line of the present embodiment comprises a ground line 602 and a signal line 604. The ground line 602 comprises a first outer portion 606 and a first inner portion 608. The first outer portion 606 comprises a first pad 610, a second pad 612 and a first bonding wire 614. The first bonding wire 614 is a bond wire structure connecting the first pad 610 and a second pad 612, and the first inner portion 608 is a first conducting wire 618 arranged in the dielectric layer 616. The signal line 604 comprises a second outer portion 620 and a second inner portion 622. The second outer portion 620 comprises a third pad 624, a fourth pad 626 and a second bonding wire 628 that is a bond wire structure connecting the third pad 624 and a fourth pad 626. The second inner portion 622 is a second conducting wire 630 arranged on the dielectric layer 616.

By arranging a portion of the ground line 602 and a portion of the signal line 604 as conducting wires 618, 630 that are disposed on the dielectric layer 616, and arranging another portion of the ground line 602 and another portion of the signal line 604 as bonding wires 614, 628 that are disposed on the integrated circuit, the flexibility of the design of the integrated circuit of the present embodiment is improved.

Figure 7:
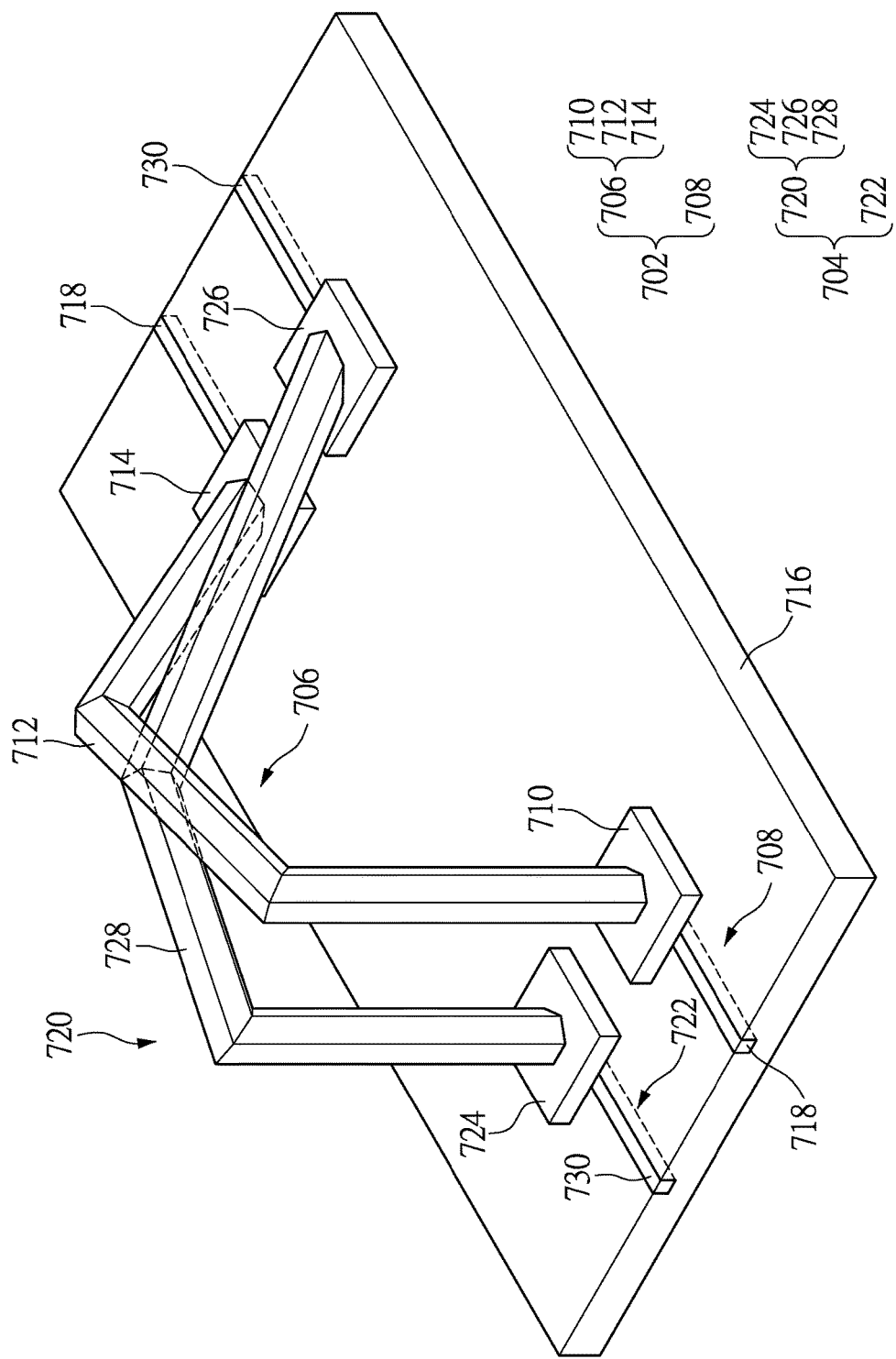
FIG. 7 is a three-dimensional schematic view of the transmission line of the integrated circuit device of an embodiment of the instant disclosure.

FIG. 7 is a three-dimensional schematic view of the transmission line of another embodiment of the instant disclosure. The difference between FIG. 7 and FIG. 6 is that the first bonding wire 614 of the ground line 602 and the second bonding wire 628 of the signal line 604 of the embodiment shown in FIG. 6 are parallel to each other, while the first bonding wire and the second bonding wire of the present embodiment intercross with each other. Specifically, as shown in FIG. 7, the transmission line of the present embodiment comprises a ground line 702 and a signal line 704. The ground line 702 comprises a first outer portion 706 and a first inner portion 708. The first outer portion 706 comprises a first pad 710, a second pad 714, and a first bonding wire 712. The first bonding wire 712 is a bond wire structure connecting the first pad 710 and the second pad 714, and the first inner portion 708 is a first conducting wire 718 arranged in the dielectric layer 716. The signal line 704 comprises a second outer portion 720 and a second inner portion 722. The second outer portion 720 comprises a third pad 724, a fourth pad 726 and a second bonding wire 728. The second bonding wire 728 is a bond wire structure connecting the third pad 724 and the fourth pad 726, and the second inner portion 722 is a second conducting wire 730 arranged in the dielectric layer 716. In the present embodiment, the first bonding wire 712 of the ground line 702 and the second bonding wire 728 of the signal line 704 crossover each other.

Figure 8:
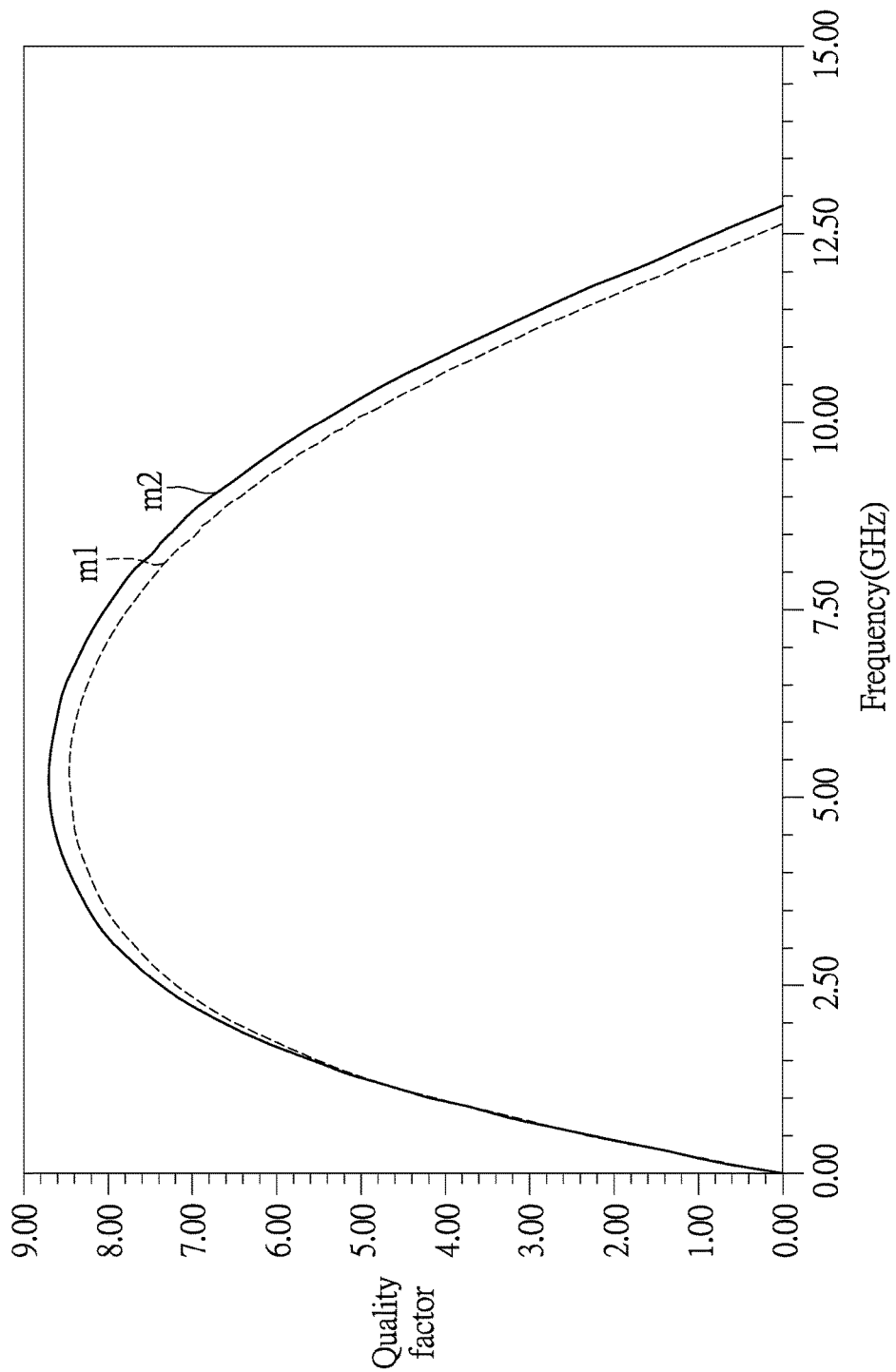
FIG. 8 shows the relation between the measured electric pole and frequency.

In order to determine whether the transmission line of the instant disclosure will generate radiation, an electric pole is disposed under the transmission line of the embodiment shown in FIG. 1. Referring to FIG. 8, the relationship diagram between Q value (quality factor) and the frequency of signal as measured by the electric pole is shown. Referring to FIG. 8, the Q value (labeled m1) as measured by the electric pole disposed under the transmission line of the embodiment shown in FIG. 1 does not significantly degrade (only about 3% of the Q value is affected), as compared to the Q value (labeled m2) of the conventional transmission lines that do not apply such bond wire structure.

Third Embodiment

Figure 9A:
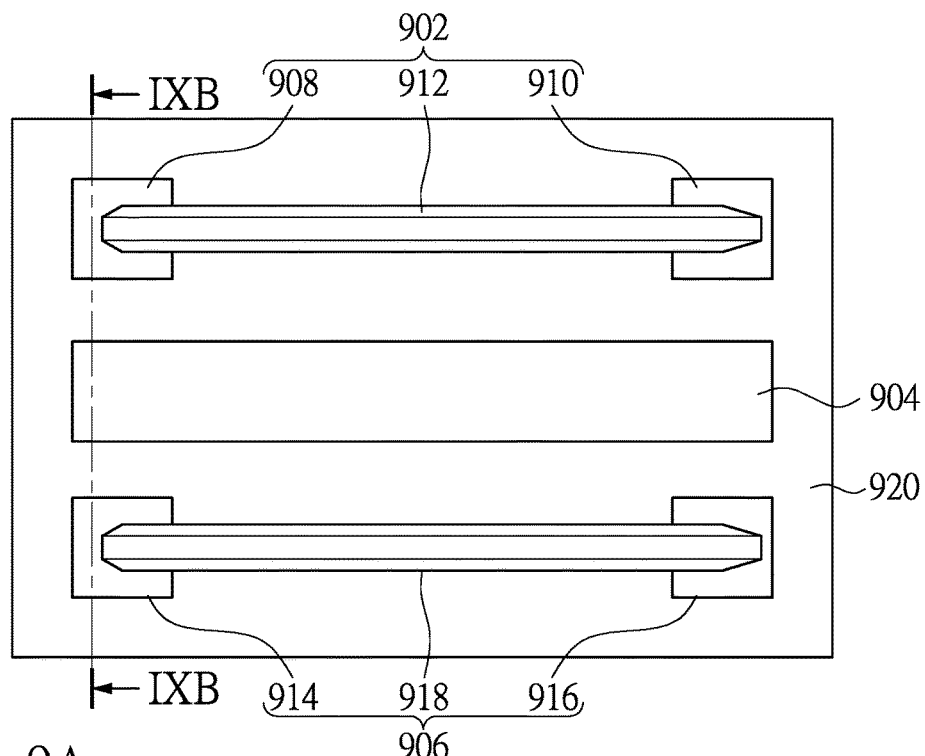
FIG. 9A is a planar schematic view of the transmission line of the integrated circuit device of an embodiment of the instant disclosure.
Figure 9B:
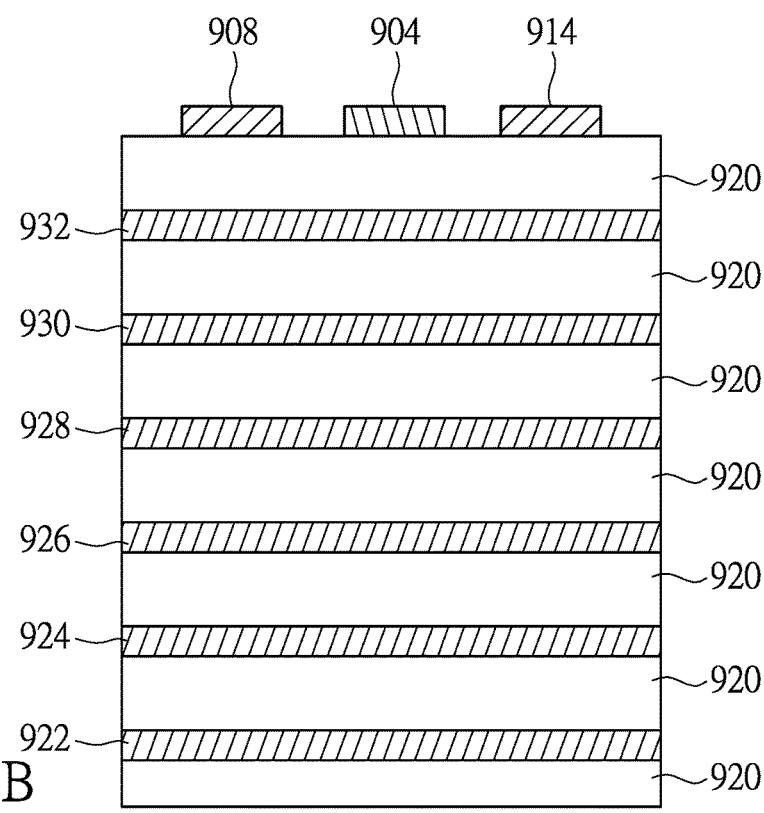
FIG. 9B is a sectional schematic view of the transmission line of the integrated circuit device of an embodiment of the instant disclosure.

Different from the above embodiments which utilize bonding wires for both the ground line(s) and the signal line(s), the present embodiment employs bond wire structure for ground lines only, and employs integrated circuit lines for signal lines. In other embodiments, bond wire structure may be applied for signal line(s) only, and integrated circuit lines for ground line(s) may be employed. FIG. 9A is a planar view of the transmission line of the present embodiment, and FIG. 9B is a sectional view taken along the sectional line IXB-IXB. Please refer to FIG. 9A and FIG. 9B. The present embodiment employs a Ground-Signal-Ground (GSG) transmission line as an example. The transmission line of the present embodiment comprises a first ground line 902, a signal line 904 and a second ground line 906. The first ground line 902 comprises a first pad 908, a second pad 910, and a first bonding wire 912 that is a bond wire structure connecting the first pad 908 and the second pad 910. The second ground line 906 comprises a third pad 914, a fourth pad 916, and a second bonding wire 918 that is a bond wire structure connecting the third pad 914 and the fourth pad 916. The signal line 904 is a top metal layer arranged on the dielectric layer 920 of the integrated circuit.

As shown in FIG. 9A and FIG. 9B, in the present embodiment, the first pad 908, the second pad 910, the third pad 914, and the fourth pad 916 can be arranged on the same layer with the top metal layer 904. However, the instant disclosure is not limited thereto. The first pad 908, the second pad 910, the third pad 914 and the fourth pad 916 can be arranged on layers different from that of the top metal layer 904. As shown in FIG. 9B, the signal line 904 may further comprises a plurality of metal layers disposed under the dielectric layer 920. For example, in FIG. 9B, the signal line 904 further comprises, from the bottom to the top, a first metal layer 922, a second metal layer 924, a third metal layer 926, a fourth metal layer 928, a fifth metal layer 930, and a sixth metal layer 932. However, FIG. 9B is only one example illustrated. In fact, the signal line 904 of the integrated circuit device may comprise more metal layers or less, and logic units such as transistors may be arranged under the metal layers. For example, the integrated circuit device may comprise memory units such as capacitors. The instant disclosure can be adapted for any types of integrated circuit device and may further comprise active elements or passive components which are not described herein for brevity.

It should be noted that the bond wire structure of the bonding wires of the transmission lines of the instant disclosure are wires within the integrated chip and the sizes thereof may be different from the bonding wires that are used for connecting the metal pad to a lead frame. In some embodiments, the transmission line is used for transmitting radio frequency (RF) signals.

Fourth Embodiment

Figure 10A:
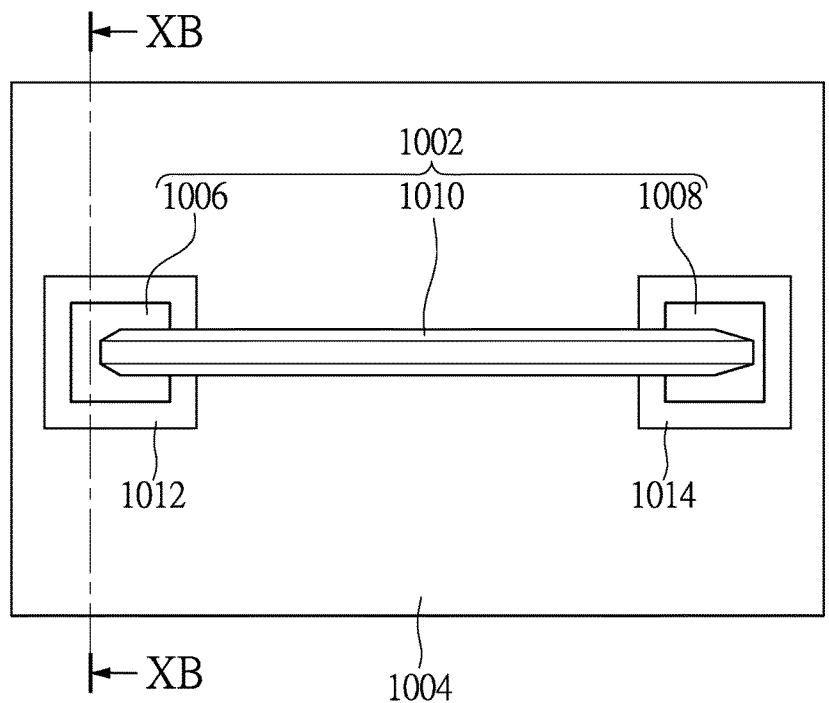
FIG. 10A is a planar schematic view of the transmission line of the integrated circuit device of an embodiment of the instant disclosure.
Figure 10B:
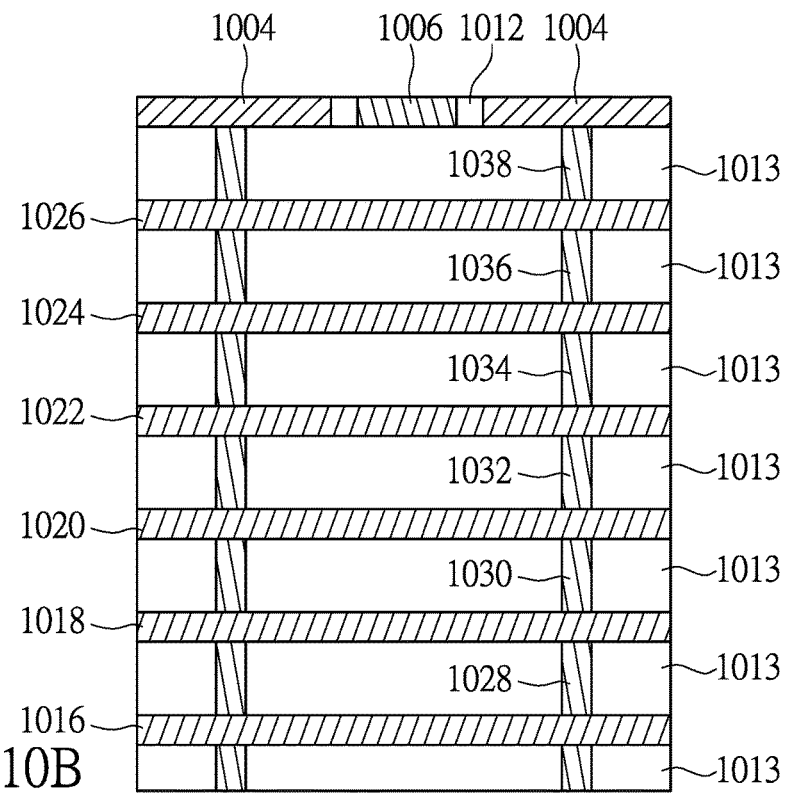
FIG. 10B is a sectional schematic view of the transmission line of the integrated circuit device of an embodiment of the instant disclosure.

FIG. 10A is the planar view of the transmission line of the present embodiment. FIG. 10B is the sectional schematic view taken along the sectional line XB-XB of FIG. 10A. Please refer to FIG. 10A and FIG. 10B, the present embodiment includes a Ground-Signal (GS) transmission line as an example. The transmission line of the present embodiment comprises a signal line 1002 and a ground line 1004. The signal line 1002 comprises a first pad 1006, a second pad 1008, and a first bonding wire 1010 that is a bond wire structure connecting the first pad 1006 and the second pad 1008. The ground line 1004 is a top metal layer arranged on the dielectric layer of the integrated circuit. As shown in FIG. 10A, the ground line 1004 (the top metal layer) surrounds the first pad 1006 and the second pad 1008. Specifically, the ground line 1004 (the top metal layer) has a first opening 1012 and a second opening 1014. The first pad 1006 of the signal line 1002 is arranged in the first opening 1012, and the second pad 1008 of the signal layer 1002 is arranged in the second opening 1014. As shown in FIG. 10B, a plurality of metal layers is formed under the top metal layer 1004 and in the dielectric layer 1013, and includes a first metal layer 1016, a second metal layer 1018, a third metal layer 1020, a fourth metal layer 1022, a fifth metal layer 1024, and a sixth metal layer 1026. In addition, a first conductive connection 1028, a second conductive connection 1030, a third conductive connection 1032, a fourth conductive connection 1034, a fifth conductive connection 1036 and a sixth conductive connection 1038 are arranged in the dielectric layer 1013 for connecting the adjacent metal layers.

Effectiveness of the Embodiments

In summary, the advantages of the instant disclosure reside in that since some or all of the ground lines and/or the signal lines of the transmission line adopt a bond wire structure formed by wire bonding, the space occupied by the transmission lines in the integrated circuit can be reduced, and a sufficient low characteristic impedance and a higher Q value compared to the existing integrated circuit transmission line can be achieved. Under the requirement that the size of the manufactured integrated circuit devices has to be smaller in size, the instant disclosure can provide design flexibility for the integrated circuit and prevent the properties of the integrated circuit devices from deteriorating due to the reduced size. Accordingly, the difficulties in designing the integrated circuit are alleviated and the flexibility of the design is improved. In addition, the transmission lines employing bond wire structure have less coupling effects with the integrated circuit metal lines.

The above-mentioned descriptions present merely the exemplary embodiments of the instant disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. An integrated circuit device, comprising:
   a transmission line comprising:
   a signal line; and
   a ground line;
   wherein one of the signal line and the ground line comprises:
   a first pad;
   a second pad; and
   a first bonding wire, the first bonding wire being a bond wire structure connecting the first pad and the second pad;
   wherein the other one of the signal line and the ground line comprises a top metal layer arranged on a dielectric layer, and the top metal layer has a first side portion adjacent to the first pad, a second side portion opposite to the first side and adjacent to the second pad, and a connection portion electrically connected between the first side portion and the second side portion without wire bonding; and
   wherein the top metal layer does not overlap with the first bonding wire with respect to the dielectric layer.

2. The integrated circuit device according to claim 1, wherein the signal line comprises the top metal layer arranged on the dielectric layer, the ground line comprises the first pad, the second pad, and the first bonding wire connecting the first pad and the second pad.

3. The integrated circuit device according to claim 2, further comprises another signal line comprising a third pad and a fourth pad, and a second bonding wire connecting the third pad and the fourth pad.

4. The integrated circuit device according to claim 2, wherein a plurality of additional metal layers is comprised under the top metal layer.

5. The integrated circuit device according to claim 1, wherein the ground line comprises the top metal layer arranged on the dielectric layer, the signal line comprises the first pad, the second pad and the first bonding wire connecting the first pad and the second pad.

6. The integrated circuit device according to claim 5, wherein the top metal layer surrounds the first pad and the second pad.

7. The integrated circuit device according to claim 5, wherein a plurality of metal layers and a plurality of conductive connections connecting the metal layers are comprised under the ground line.

8. The integrated circuit device according to claim 1, wherein the integrated circuit device comprises a chip and the transmission line is located inside the chip.

* * * * *